United States Patent [19]

Kim et al.

[11] Patent Number: 5,345,511
[45] Date of Patent: Sep. 6, 1994

[54] DIGITAL SIGNAL ATTENUATION CIRCUIT FOR A COMPACT DISC-INTERACTIVE PLAYER

[75] Inventors: Sung H. Kim; Byung S. You, both of Seoul, Rep. of Korea

[73] Assignee: Goldstar Co., Ltd., Seoul, Rep. of Korea

[21] Appl. No.: 22,730

[22] Filed: Feb. 24, 1993

[30] Foreign Application Priority Data

Feb. 24, 1992 [KR] Rep. of Korea .................. 92-2785

[51] Int. Cl.⁵ .................................................. H03G 3/00
[52] U.S. Cl. .................................................. 381/104
[58] Field of Search ............... 381/104, 105, 107, 108, 381/109

[56] References Cited

U.S. PATENT DOCUMENTS 4,454,498 6/1984 Southard .
4,731,851 3/1988 Christopher .................. 381/104

FOREIGN PATENT DOCUMENTS 019261 11/1980 European Pat. Off. .
261954 3/1988 European Pat. Off. .
2091918 8/1982 United Kingdom .

OTHER PUBLICATIONS

"Serial Control Type Electronic vol. Control", CMOSLSI, LC753–Jun. 1991.

*Primary Examiner*—Forester W. Isen
*Attorney, Agent, or Firm*—Helfgott & Karas

[57] ABSTRACT

A digital signal attenuation circuit for a CD-I player, specially designed to digitally attenuate an audio signal read-out from a CD-I disc, which comprises a 1/6 divider for dividing by 6 an attenuation control signal inputted from a controller and outputting a quotient signal and a remainder signal, a first attenuator for attenuating a 16-bit parallel digital audio signal obtained from a CD-I disc by $-1$ dB within the range of 0 to $-5$ dB in accordance with the remainder signal from the 1/6 divider, and a second attenuator for attenuating an output signal of the first attenuator by $-6$ dB within the range of 0 to $-96$ dB in accordance with the quotient signal from the 1/6 divider. According to the invention, the audio signal can be attenuated precisely by $-1$ dB within the range of 0 to $-96$ dB, not depending on the environmental conditions, and the overall attenuation circuitry can be highly simplified.

5 Claims, 2 Drawing Sheets

DIGITAL SIGNAL ATTENUATION CIRCUIT FOR A COMPACT DISC-INTERACTIVE PLAYER

BACKGROUND OF THE INVENTION

1. Field of the Invention

The present invention relates to a digital signal attenuation circuit for a compact disc—interactive(CD-I) player, and more particularly to a digital signal attenuation circuit which can digitally attenuate an audio signal read-out from a CD-I disc.

2. Description of the Prior Art

A CD-I player is a kind of reproducing apparatus which can read out and reproduce audio and video signals recorded on a CD-I disc in which the audio and video signals as well as audio and video information data are recorded, and which can control the output levels of the read-out audio and video signals by software, utilizing a mouse, a remote-controller, etc.

An audio signal attenuation circuit for a CD-I player can be grouped into an analog signal attenuation circuit and a digital signal attenuation circuit. The standard of attenuation required for such attenuation circuits is set to attenuate the audio signal by −1 dB within the range of 0 to −127 dB.

The analog signal attenuation circuit attenuates the analog audio signal which is converted from the digital audio signal obtained from the CD-I disc in accordance with 7-bit attenuation control signal from a system controller. Serial control type electronic volume control IC(IC No.: LC7535 manufactured by a Japanese company, Sanyo Electronic Co., Ltd.) is one of the conventional analog signal attenuation circuits, which can attenuate an analog signal by −1 dB within the range of 0 to −80 dB.

As shown in FIG. 1, a CD-I player incorporating such a conventional analog signal attenuation circuit comprises a microprocessor 10 as a system controller, an ADPCM (Adaptive Differential Pulse Code Modulation) decoder 30 for decoding an ADPCM audio data signal read-out from a CD-I disc to a digital audio signal, and a digital/analog(D/A) converter 40 for converting the digital audio signal from the ADPCM decoder 30 into an analog signal. A low-pass filter 50 for eliminating a high-frequency noise signal from the output signal of the D/A converter 40, an analog signal attenuator 60 for attenuating the output signal of the low-pass filter 50 by −1 dB within the range of 0 to −80 dB according to attenuation data from the microprocessor 10, and an amplifier 70 for amplifying the output signal of the analog signal attenuator 60 and outputting the amplified signal to a loudspeaker 80 are also provided.

According to the circuit as described above, the ADPCM audio data signal read-out from CD-I disc 20 is decoded to a digital audio signal by ADPCM decoder 30 under the control of microprocessor 10, and the decoded digital audio signal is converted into the analog signal by D/A converter 40. The analog signal is inputted to analog signal attenuator 60 through the low-pass filter 50 for eliminating the high-frequency noise signal from the analog signal, and then attenuated for a desired decibel(dB) value within the range of 0 to −80 dB by analog signal attenuator 60 under the control of microprocessor 10. The analog signal attenuated by attenuator 60 is outputted to the loudspeaker 80 after being amplified by amplifier 70.

However, such a conventional analog signal attenuation circuit as described above suffers from the disadvantage in that, since the conventional circuit is directed to the attenuation of the analog audio signal converted from the digital audio signal, much noise may be easily generated in the attenuated analog signal. Also, the analog signal attenuator should include a resistor array having a plurality of resistors to meet the required attenuation standard and a plurality of switches connected therebetween so that the analog audio signal may be attenuated by selectively turning on/off the switches in accordance with the attenuation control signal outputted from microprocessor 10, with the result that it is difficult to effect precise attenuation by −1 dB within the range of 0 to −80 dB since the performance characteristic of the resistors may easily vary due to a change in environmental conditions such as temperature, humidity and so on. Further, the analog signal attenuator requires extra peripheral circuits including a number of linear elements such as capacitors, operational amplifiers, resistors, etc., and thus the overall circuitry is greatly complicated.

Meanwhile, the conventional digital signal attenuation circuit comprises a memory receiving the 7-bit attenuation control signal from the system controller as an address signal thereof and storing attenuation data for attenuating the digital audio signal by −1 dB within the range of the attenuation standard; and a logic circuit for calculating the attenuation value of the digital audio signal using the attenuation data outputted from the memory. In this circuit, the attenuation data for 0 to −127 dB stored in the memory are outputted in accordance with the attenuation control signal from the controller and the logic circuit calculates the attenuation value of the digital audio signal by −1 dB utilizing the attenuation data from the memory.

However, the memory used in such a conventional circuit should be provided with a data table of about 127×8 bits in order to meet the attenuation standard of the CD-I player. Further, the logic circuit, which calculates the attenuation value of the digital audio signal utilizing the attenuation data from the memory, may be highly complicated in structure.

SUMMARY OF THE INVENTION

The present invention has been made to overcome the problems involved in the prior art. It is an object of the present invention to provide a digital signal attenuation circuit for a CD-I player which can minimize noise generation and can attenuate an audio signal precisely by −1 dB within the range of the attenuation standard of the CD-I player, not depending on environmental conditions, by digitally attenuating a digital audio signal which is decoded from an ADPCM audio data signal read-out from a CD-I disc and then converting the attenuated digital audio signal into an analog signal.

It is another object of the present invention to provide a digital signal attenuation circuit for a CD-I player which can highly simplify the overall circuitry by performing the digital audio signal attenuation by two subdivided steps.

In order to achieve the above objects, the digital signal attenuation circuit for a CD-I player according to the present invention comprises:

a 1/6 divider for dividing an attenuation control signal inputted from a controller by 6 and outputting a quotient signal and a remainder signal as a result;

a first attenuator for attenuating a digital audio signal which is decoded from an ADPCM audio data signal obtained from a CD-I disc by −1 dB within the range of 0 to −5 dB in accordance with the remainder signal from the 1/6 divider; and a second attenuator for attenuating an output signal from the first attenuator by −6 dB within the range of 0 to −96 dB in accordance with the quotient signal from the 1/6 divider.

BRIEF DESCRIPTION OF THE DRAWINGS

The above objects and other features of the present invention will become more apparent by describing the preferred embodiment of the present invention with reference to the accompanying drawings, in which.

DETAILED DESCRIPTION OF THE PREFERRED EMBODIMENTS

Figure 1:
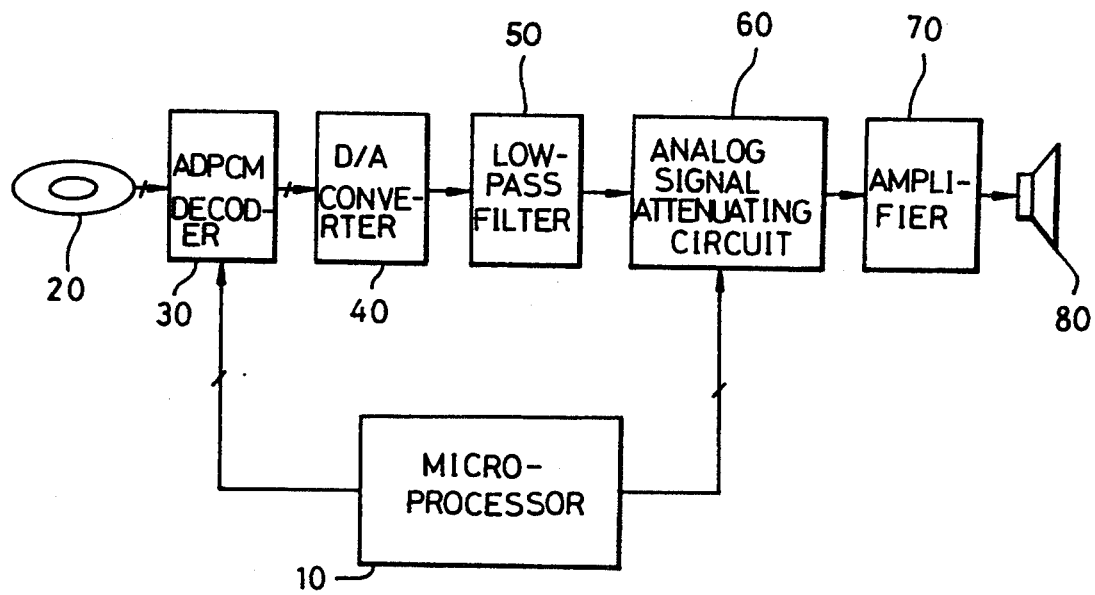
FIG. 1 is a schematic block diagram of a CD-I player in which the conventional analog signal attenuation circuit is incorporated.
Figure 2:
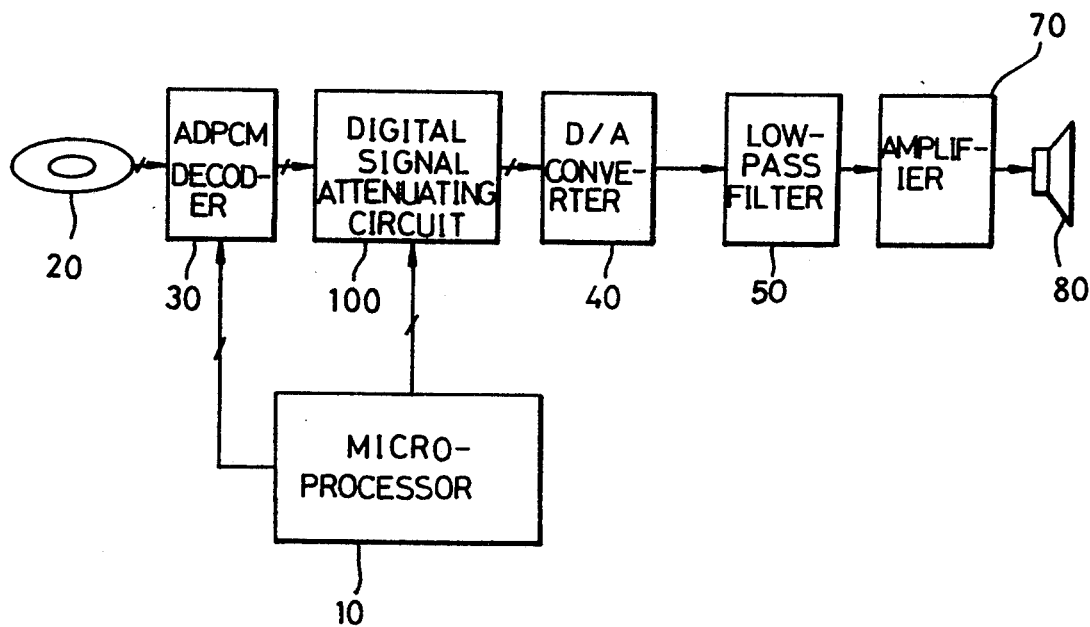
FIG. 2 a schematic block diagram of a CD-I player in which the digital signal attenuation circuit according to the present invention is incorporated.

Referring to FIG. 2 showing the CD-I player circuit incorporating the digital signal attenuation circuit according to the present invention, a microprocessor 10 is employed as a system controller. An ADPCM audio data signal read-out from a CD-I disc 20 is decoded to a 16-bit parallel digital audio signal by an ADPCM decoder 30 under the control of the microprocessor 10. The digital audio signal is then attenuated by −1 dB within the range of 0 to −96 dB by digital signal attenuation circuit 100 according to the present invention under the control of microprocessor 10, and the attenuated digital audio signal is converted into an analog audio signal by D/A converter 40. The analog audio signal from the D/A converter 40 is amplified by amplifier 70 after a high-frequency noise signal contained therein is eliminated by low-pass filter 50, and then the analog audio signal is outputted to loudspeaker 80.

Figure 3:
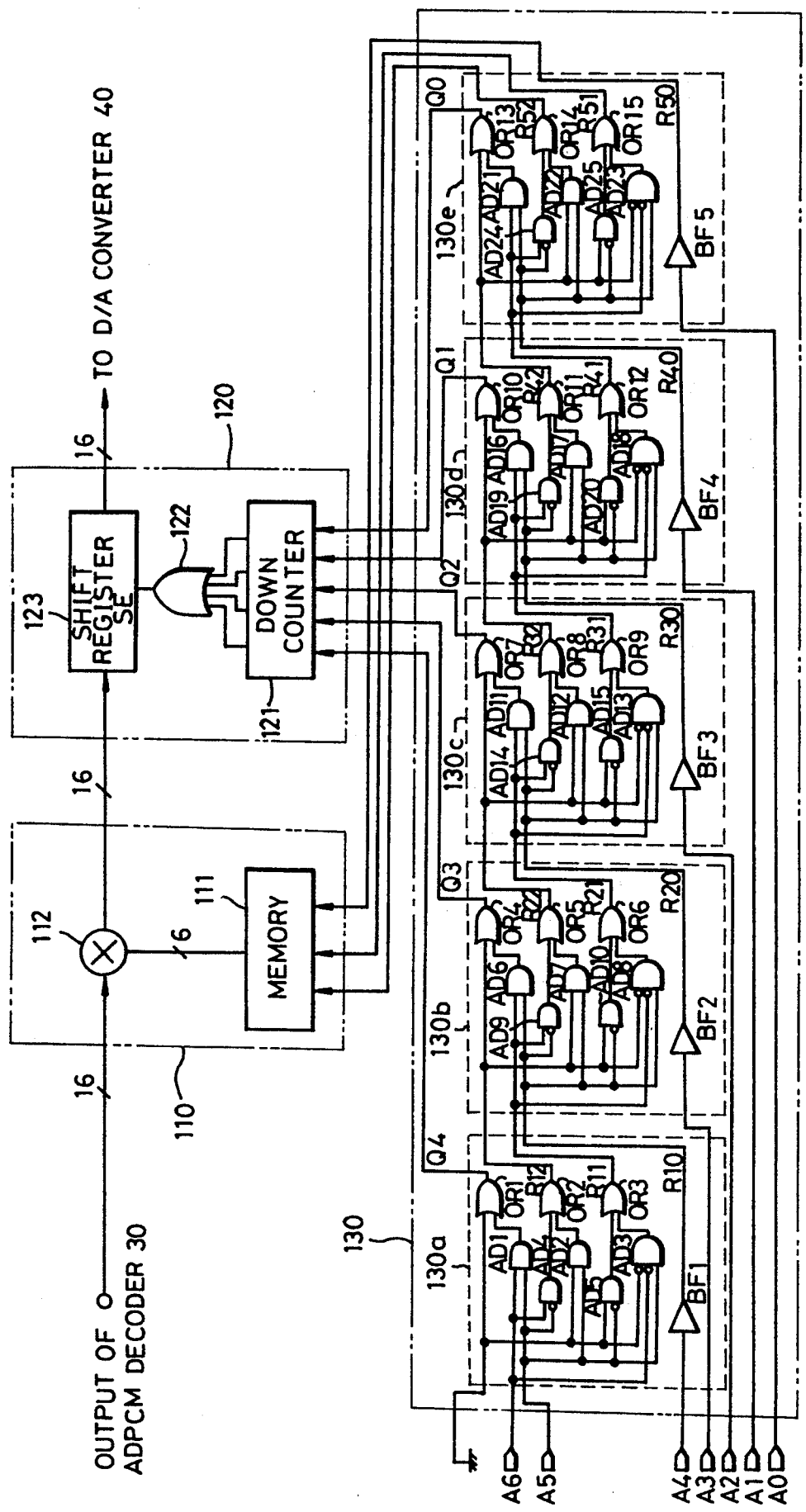
FIG. 3 is a circuit diagram of an embodiment of the digital signal attenuation circuit of FIG. 1.

Referring to FIG. 3 showing an embodiment of the digital signal attenuation circuit 100 according to the present invention, the circuit 100 comprises: a 1/6 divider 130 for dividing by 6 a 7-bit attenuation control signal A6 to A0 from the microprocessor 10 and outputting a quotient signal Q4 to Q0 and a remainder signal R52 to R50; a first attenuator 110 for attenuating the digital audio signal from the ADPCM decoder 30 by −1 dB within the range of 0 to −5 dB in accordance with the remainder signal R52 to R50 from the 1/6 divider 130; and a second attenuator 120 for attenuating the output signal from the first attenuator 110 by −6 dB within the range of 0 to −96 dB in accordance with the quotient signal Q4 to Q0 from the 1/6 divider 130.

In the embodiment, first attenuator 110 includes memory 111 receiving remainder signal R52 to R50 from 1/6 divider 130 as an address signal thereof and outputing the corresponding attenuation data stored therein; and multiplier 112 for multiplying the 16-bit parallel digital audio signal outputted from ADPCM decoder 30 by the attenuation data outputted from memory 111. Memory 111 stores the attenuation data by which the digital audio signal is attenuated by −1 dB within the range of 0 to −5 dB, and outputs the attenuation data in accordance with remainder signal R52 to R50 from 1/6 divider 130.

Second attenuator 120 includes counter 121 for down-counting quotient signal Q4 to Q0 outputted from 1/6 divider 130; and OR gate 122 for OR-gating the output signal of counter 121; and shift register 123 for shifting the 16-bit parallel output signal of first attenuator 110 in due order in accordance with the output signal of OR gate 122 to attenuate the output signal from first attenuator 110 by −6 dB within the range of 0 to −96 dB.

In the other embodiment, second attenuator 120 comprises only a Barrel shift register (not illustrated) for simultaneously shifting the output signal of first attenuator 110 for the number of bits which is represented by 5-bit quotient signal Q4 to Q0 from 1/6 divider 130.

The 1/6 divider 130 comprises first to fifth dividing sections 130a to 130e. The first dividing section 130a includes AND gates AD1 to AD5, OR gates OR1 to OR3 and buffer BF1, and divides by 6 a 4-bit signal composed of one bit of '0' logic level and 3 bits A6 to A4 of the 7-bit attenuation signal A6 to A0 from microprocessor 10 to output quotient Q3 and 3-bit remainder R12 to R10; second dividing section 130b includes AND gates AD6 to AD10, OR gates OR4 to OR6 and buffer BF2, and divides by 6 a 4-bit signal composed of 3-bit remainder R12 to R10 of first dividing section 130a and one bit A3 of the 7-bit attenuation control signal to output quotient Q3 and 3-bit remainder R22 to R20; third dividing section 130C includes AND gates AD11 to AD15, OR gates OR7 to OR9 and buffer BF3, and divides by 6 a 4-bit signal composed of 3-bit remainder R22 to R20 of second dividing section 130b and one bit A2 of the 7-bit attenuation control signal to output quotient Q2 and 3-bit remainder R32 to R30; fourth dividing section 130d includes AND gates AD16 to AD20, OR gates OR10 to OR12 and buffer BF4, and divides by 6 a 4-bit signal composed of 3-bit remainder R32 to R30 of third dividing section 130C and one bit A1 of the 7-bit attenuation control signal to output quotient Q1 and 3-bit remainder R42 to R40; fifth dividing section 130e includes AND gates AD21 to AD25, OR gates OR13 to OR15 and buffer BF5, and divides by 6 a 4-dividing section 130d and one bit (i.e., least significant bit) AO of the 7-bit attenuation control signal to output quotient QO and 3-bit remainder R52 to R50.

Now, the operation and effect of the digital signal attenuation circuit according to the present invention constructed as above will be described in detail with reference to FIGS. 2 and 3.

When 7-bit attenuation control signal A6 to A0 is inputted from microprocessor 10, 1/6 divider 130 divides the attenuation control signal A6 to A0 by 6 and outputs a 5-bit quotient Q4 to Q0 and a 3-bit remainder R52 to R50.

According to the truth table for 1/6 division of a 4-bit signal, the relationship between the 4-bit input D3 to D0 and 4-bit output Q, R2 to R0 of the divider can be expressed as follows:

$$Q = D3 + D2 * D1$$

$$R2 = D2 * \overline{D1} + D3 * D1$$

$$R1 = D3 * \overline{D1} + \overline{D3} * \overline{D2} * D1$$

$$R0 = D0$$

In order to satisfy the above-mentioned relationship, first dividing section 130a comprises AND gates AD1 to AD5, OR gates OR1 to OR3 and buffer BF1. Each of the second to fifth dividing sections 130b to 130e has the same construction and function as first dividing section 130a.

First dividing section 130a divides by 6 the 4-bit signal composed of one bit of "0" logic level and 3 bits A6 to A4 of the attenuation control signal, and outputs the quotient Q4 and remainder R12 to R10. The remainder R12 to R10, along with one bit A3 of the attenuation control signal, is then inputted to second dividing section 130b as a dividend.

In order to divide the 7-bit attenuation control signal A6 to A0 by 6, the first to fifth dividing sections 130a to 130e are connected with one another so that a 4-bit signal composed of the 3-bit remainder outputted from each preceding dividing section and each bit of the attenuation control signal A3 to A0 is inputted to each following dividing section in due order.

The 5-bit quotient Q4 to Q0 from dividing sections 130a to 130e is outputted to second attenuator 120, and 3-bit remainder R52 to R50 from fifth dividing section 130e is outputted to first attenuator 110.

The 3-bit remainder R52 to R50 outputted from the 1/6 divider 130 is applied to memory 111 in first attenuator 110 as an address signal and accordingly, memory 111 outputs the attenuation data stored in the corresponding address thereof. In the embodiments, memory 111 is embodied by a ROM (Read Only Memory) which stores 5 attenuation data within the range of −1 dB to −5 dB. Multiplier 112 multiplies the 16-bit parallel digital audio signal from ADPCM decoder 30 by the attenuation data from memory 111 to attenuate the digital audio signal by −1 dB within the range of 0 to −5 dB.

The second attenuator 120 attenuates the 16-bit digital audio signal outputted from first attenuator 110 by −6 dB within the range of 0 to −96 dB in accordance with 5-bit quotient Q4 to Q0 from 1/6 divider 130. In order to attenuate the digital audio signal by −6 dB, second attenuator 120 performs the same function as a multiplier for multiplying the digital audio signal by ½ since the half of the input voltage corresponds to −6 dB.

The 5-bit quotient Q4 to Q0 from 1/6 divider 130 is loaded to loadable 5-bit down counter 121 in second attenuator 120 and counter 121 down-counts the loaded quotient Q4 to Q0. The 4-bit output signal of counter 121 is OR-gated by the OR gate 122 and the output signal of the OR gate 122 is applied to the shift-enable terminal SE of shift register 123.

If the output value of counter 121 becomes "0", counter 121 maintains its output value "0" until the following quotient Q4 to Q0 is loaded thereto. When the output value of counter 121 becomes "0" as above, all inputs of OR gate 112 become "0", causing the output of OR gate 122 to become "0". Otherwise, the output of OR gate 122 is kept in "0" level.

When the output of OR gate 122 becomes "1", shift register 123 is shift-enabled and thus shifts each bit of the 16-bit digital audio signal, which has been firstly attenuated by first attenuator 110 and loaded to the shift register 123, to the respective lower bits in due order, causing the digital audio signal to be attenuated by half, i.e., by −6 dB. When the output of OR gate 122 becomes "0", shift register 123 stops the shifting operation, causing further attenuation not to be achieved. By repeating the above-mentioned operations, second attenuator 120 attenuates the digital audio signal by −6 dB within the range of 0 to −96 dB in accordance with the value of the quotient Q4 to Q0 from 1/6 divider 130 and outputs the attenuated digital audio signal to D/A converter 40.

In the other embodiment, second attenuator 120 is composed of a Barrel shift register and simultaneously shifts the output signal of first attenuator 110 for the number of bits represented by the 5-bit quotient Q4 to Q0 from 1/6 divider 130.

According to the embodiments of the present invention, it is exampled that the 16-bit parallel digital audio signal from ADPCM decoder 30 is attenuated by passing through first and second attenuators 110 and 120 in due order. However, as an alternative, the digital audio signal may be firstly attenuated by −6 dB within the range of 0 to −96 dB by second attenuator 120 and then attenuated by −1 dB within the range of 0 to −5 dB by first attenuator 110.

From the foregoing, it will be apparent that the present invention provides a novel digital signal attenuation circuit for a CD-I player specially designed to digitally attenuate the digital audio signal decoded from the ADPCM audio data signal read-out from the CD-I disc in accordance with the attenuation control signal from the controller before converting the digital audio signal into an analog signal, thereby minimizing noise generation and attenuating the audio signal precisely by −1 dB within the range of the attenuation standard of the CD-I player, not depending on the environmental conditions. Further, the present invention provides the advantage in that the overall circuitry can be highly simplified by performing the digital audio signal attenuation by two subdivided steps. The digital signal attenuation circuit according to the present invention may be also applicable to other digital audio systems having characteristics similar to the CD-I player.

While the present invention has been described and illustrated herein with reference to the preferred embodiments thereof, it will be understood by those skilled in the art that various changes in form and details may be made therein without departing from the spirit and scope of the invention.

What is claimed is:

1. A digital signal attenuation circuit for a compact disc-interactive player, comprising:
   a 1/6 divider for dividing by 6 an attenuation control signal inputted from a controller and outputting a quotient signal and a remainder signal as a result;
   a first attenuator for attenuating a digital audio signal which is decoded from an adaptive differential pulse code modulation audio data signal obtained from a compact disc by −1 dB within the range of 0 to −5 dB in accordance with said remainder signal from said 1/6 divider; and
   a second attenuator for attenuating an output signal of said first attenuator by −6 dB within the range of 0 to −96 dB in accordance with said quotient signal from said 1/6 divider;
   wherein said 1/6 divider comprises first to fifth dividing sections, each of said dividing sections having the same construction with one another and dividing by 6 a 4-bit input signal; and
   wherein one bit of "0" level and 3 higher bits of said attenuation control signal from said controller are inputted to said first dividing section, 3-bit remainder signals from said first to fourth dividing sections and 4 lower bits of said attenuation control signal are respectively inputted to said second to fifth dividing sections in due order, a 3-bit remainder signal from said fifth dividing section is inputted to said first attenuator, and a 5-bit quotient signal from said first to fifth dividing sections is inputted to said second attenuator.

2. A digital signal attenuation circuit as claimed in claim 1, wherein said digital audio signal is firstly attenuated by said second attenuator and then an output signal of said second attenuator is attenuated by said first attenuator.

3. A digital signal attenuation circuit as claimed in claim 1, wherein said first attenuator comprises:
   a memory receiving said remainder signal from said 1/6 divider as an address signal thereof and storing attenuation data for attenuating said digital audio signal by −1 dB within the range of 0 to −5 dB; and
   a multiplier for multiplying said digital audio signal by said attenuation data outputted from said memory.

4. A digital signal attenuation circuit as claimed in claim 1, wherein said second attenuator comprises:
   a counter for down-counting said quotient signal from said 1/6 divider;
   an OR gate for OR-gating an output signal of said counter; and
   a shift register for shifting said output signal of said first attenuator in due order in accordance with an output signal of said OR gate to attenuate said output signal from said first attenuator by −6 dB within the range of 0 to −96 dB.

5. A digital signal attenuation circuit as claimed in claim 1, wherein said second attenuator comprises a Barrel shift register for simultaneously shifting said output signal of said first attenuator for the number of bits represented by said quotient signal from said 1/6 divider.

* * * * *